United States Patent [19]

Furuhata

[11] Patent Number: 5,091,664
[45] Date of Patent: Feb. 25, 1992

[54] INSULATED GATE BIPOLAR TRANSISTOR CIRCUIT WITH OVERCURRENT PROTECTION

[75] Inventor: Shoichi Furuhata, Kanagawa, Japan

[73] Assignee: Fuji Electric Co., Ltd., Kanagawa, Japan

[21] Appl. No.: 482,896

[22] Filed: Feb. 22, 1990

[30] Foreign Application Priority Data

Apr. 7, 1989 [JP] Japan .................... 1-89035

[51] Int. Cl.$^5$ ................ H03K 17/08; H03K 17/28
[52] U.S. Cl. ........................... 307/570; 307/572; 307/575; 307/544; 307/270; 361/98
[58] Field of Search ............ 307/570, 446, 572, 573, 307/575, 585, 584, 544, 270; 361/93, 98, 100

[56] References Cited

U.S. PATENT DOCUMENTS

| | | | |
|---|---|---|---|
| 4,581,540 | 4/1986 | Guajardo | 307/577 |
| 4,721,869 | 1/1988 | Okado | 307/570 |
| 4,841,166 | 6/1989 | Harnden | 307/572 |

FOREIGN PATENT DOCUMENTS

| | | | |
|---|---|---|---|
| 0190925 | 8/1986 | European Pat. Off. | 307/570 |
| 0105521 | 5/1988 | Japan | 307/570 |
| 63-129863 | 7/1989 | Japan . | |

Primary Examiner—Timothy P. Callahan
Attorney, Agent, or Firm—Finnegan, Henderson, Farabow, Garrett, and Dunner

[57] ABSTRACT

A semiconductive device integrated on a single chip and adapted for self-protecting use in control applications, including an insulated gate bipolar transistor (IGBT) useful as a series controller for a load. In the event of a load failure (short), the upward current excursion is inhibited by a control arrangement in which a sensing resistor in the emitter circuit of the IGBT turns on a three-terminal signal shunt across the signal control path of the IGBT. The signal shunt includes a voltage dropping element such as a Zener diode and may also include Zener reverse-voltage protection. The sensing resistor may be placed in the low-current branch of a split-emitter current path of the IGBT. A pulsed constant-amplitude driving signal may be applied to the control signal path of the IGBT through serially-connected NPN and PNP bipolar transistors providing a common driving node connected through a serial impedance to the control signal path of the IGBT and to the signal shunt.

6 Claims, 2 Drawing Sheets

INSULATED GATE BIPOLAR TRANSISTOR CIRCUIT WITH OVERCURRENT PROTECTION

BACKGROUND OF THE INVENTION

1. Field of the Invention

The present invention relates to a semiconductor device provided with an insulated gate element to be used for switching the main circuit of a power conversion apparatus such as an inverter apparatus or the like for electric motor control.

2. Description of the Related Art

Upon shorting of an output circuit of an inverter apparatus or the like using series semiconductor switching power elements, excessive electric power is applied to the switching power elements, thereby sometimes causing them to break down or fail. In order to improve the breakdown resistance of such power elements, conventionally, various contrivances have been made. As the conventional technique, there has been proposed, for example, "an insulated gate element driving circuit" as disclosed in Japanese Patent Application No. 63-129863 filed by the applicant of this application.

The insulated gate element is an element such as a power MOSFET driven to be on/off in response to presence or absence of a gate applied voltage. As the insulated gate element of the kind as described above, an IGBT is a typical one and therefore the insulated gate element is also called an IGBT hereinafter.

By way of contrast to the approach of the present invention, FIG. 4 shows an example of the circuit for driving an IGBT used as a switching power element disclosed in the foregoing Japanese Patent Application No. 63-129863. In the drawings, items the same as or equivalent to each other are referenced correspondingly. Further, the respective states of High and Low in logic value or level are simply represented by "H" and "L". In FIG. 4, the reference numeral 10 designates a DC power source (hereinafter, referred to as a gate driving power source), for example, of 15 V for driving the gate G of an IGBT 1, and the reference numerals 8 and 9 designate auxiliary transistors for interrupting the voltage of the gate driving source 10. The reference symbol $e_D$ designates a driving signal voltage for auxiliary transistors 8 and 9, and, thus, for the IGBT 1.

In the normal state, when the driving signal voltage $e_D$ is "H", the auxiliary transistors 8 and 9 are in their "off" and "on" states respectively, and the voltage of the gate driving power source 10 is applied across the gate G and emitter E of the IGBT 1 through auxiliary transistor 9 and the resistor 7 to thereby turn-on the IGBT 1, so that a main circuit current $i_o$ flows as a collector current between the collector C and emitter E of the IGBT 1 serially through a main circuit power source (not shown) and a main circuit load (not shown).

When the driving signal voltage $e_D$ is "L", on the contrary, the auxiliary transistors 8 and 9 are in their "on" and "off" states, respectively; and the gate driving power source is shut off from the gate circuit of the IGBT 1. At the same time, shorting occurs between gate G and emitter E of the IGBT 1 through the resistor 7 and the auxiliary transistor 8 to thereby turn off the IGBT 1. Thus, the IGBT 1 is repeatedly turned on and off in accordance with the driving signal voltage $e_D$, so that a current as required for the main circuit load flows.

Further, voltage dividing resistors 2 and 3 inserted between the collector C and emitter E of the IGBT 1 and a Zener diode 6 and an auxiliary transistor 5 inserted between the gate G and emitter E of the IGBT 1 are additionally provided for protecting the main circuit from being shorted.

That is, when the main circuit current $i_o$ has a normal value, the collector-emitter voltage $eC_E$ of the IGBT 1 is low, and the voltage across the voltage-dividing resistor 3 obtained by dividing the voltage $eC_E$ by the voltage-dividing resistors 2 and 3, that is, the base B—emitter E voltage $eB_E$ of the auxiliary transistor 5, is sufficiently low so that the auxiliary transistor 5 is kept "off" as it is. As a result, also the Zener diode 6 is kept nonconductive, and the gate G—emitter E voltage (hereinafter, referred to as a gate voltage) $e_g$ of the IGBT 1 is never influenced by the Zener diode 6 and the like, so that the IGBT 1 is driven by a sufficiently high gate voltage $e_g$ which is substantially equal to the voltage (about 15 V in this example) of the gate driving power source 10 and the collector-emitter voltage $eC_E$ of the IGBT 1 can become a sufficiently small value.

When the main circuit current $i_o$ has become excessively large because of shorting of the main serially-connected load circuit, on the contrary, the collector-emitter voltage $eC_E$ of the IGBT 1 becomes high, and therefore the base-emitter voltage $eB_E$ of the auxiliary transistor 5 becomes high to thereby turn-on the transistor 5 so that the gate voltage $e_g$ of the IGBT 1 is limited to the Zener voltage (about 7 V in this example) of the Zener diode 6. As a result, the overcurrent $i_o$ flowing in the main circuit is reduced in proportion to the reduction of the gate voltage $e_g$ of the IGBT 1, so that the time to the breakdown or failure of the IGBT 1 can be prolonged. Accordingly, it is possible to provide sufficient protection on account of the main circuit being shorted even by using a not-so-high-speed gate voltage turn-off circuit.

Nevertheless, the following problem requires solution.

In the foregoing circuit of FIG. 4, when the voltage between the main terminals of the switching power element rises upon shorting of an output circuit of an inverter apparatus in spite of the fact that a voltage is being applied to the control terminal thereof, the voltage across the control terminal is made to fall to thereby suppress the overcurrent. In such a method, however, it has been very difficult to integrate the circuits in one chip. This is because, particularly, the resistor 2 of FIG. 4 would then be integrated into the circuit; and it would then be difficult to raise the resistance value of the resistor 2 to a desirable value (to about 100KΩ). It is therefore an object of the present invention to solve the foregoing problem.

SUMMARY OF THE INVENTION

The present invention solves the foregoing problem by providing a semiconductor device in which a resistor for detecting an over-current flowing in a main circuit is provided in series in the controlled current path of an IGBT and the voltage across the resistor is detected to drive down a gate control voltage for the IGBT.

The present invention particularly relates to a semiconductor device having a function that, upon shorting of a main circuit, detects a short-circuit current or a portion thereof and limits it by using a resistor having a low resistance value.

In accordance with the invention, a semiconductive device of the above-described type including an insulated-gate element is improved for control applications and is made integratable on a single chip by providing a sensing means that comprises a resistive element connected to carry at least a part of the current flowing in the controlled current path of the insulated gate semiconductive element and that further comprises an auxiliary three-terminal semiconductive element that has its control signal path connected across the resistive element and has its controlled current path and a serial voltage-dropping element connected across the control signal path of the insulated gate semiconductive element.

Advantageously, in the above-described arrangement, if the main circuit current reaches or exceeds a predetermined value, the three-terminal semiconductor element turns on, and a second resistor or the Zener diode becomes conductive so that the level of the voltage control signal to be applied to the control terminal of the insulated gate semiconductor element (IGBT) is limited to drive down the main circuit current.

BRIEF DESCRIPTION OF THE DRAWINGS

Further features and advantages of the present invention will become apparent from the following detailed description, taken together with the drawings, in which.

DETAILED DESCRIPTION

Figure 1:
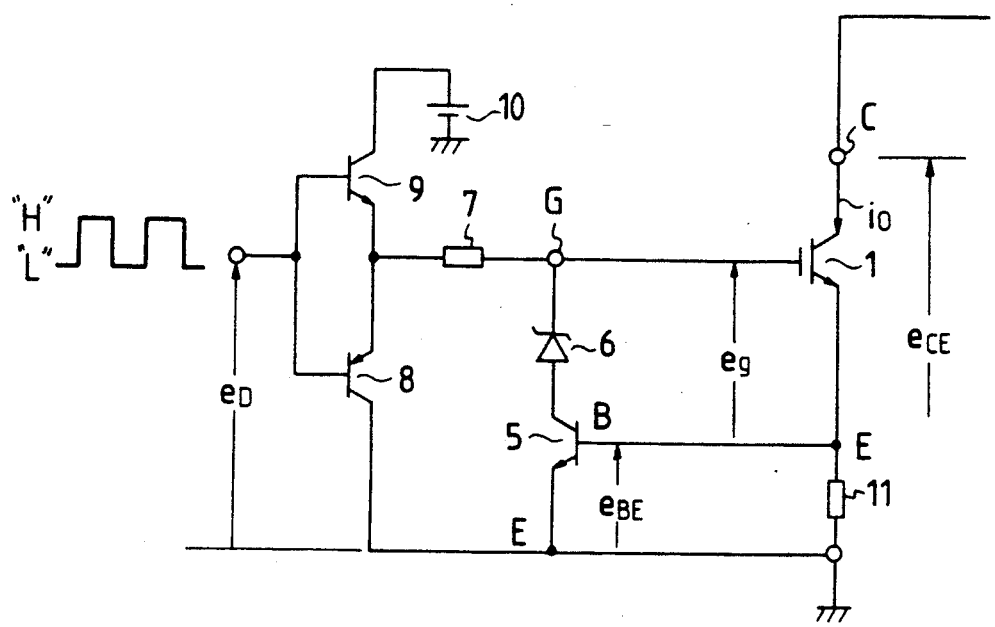
FIG. 1 is a schematic circuit diagram of a first embodiment of the invention.

Differing embodiments of the present invention will be described with reference to FIGS. 1 to 3 hereunder, and in contrast to the related art of FIG. 4. FIG. 1 is a circuit diagram showing the configuration of a first embodiment of the present invention. In FIG. 1, the voltage-dividing resistors 2 and 3 of FIG. 4 are removed, and a resistor (a first resistor) 11 is newly inserted in series with the emitter E of an IGBT 1 so that a voltage across the resistor 11 is applied across the base B and emitter E of an auxiliary transistor 5.

D.C. power source 10 is connected across the collector-emitter circuit of NPN transistor 9 emitter-collector circuit of PNP transistor 8 in series so that the emitters have a common node. That common node is connected through resistor 7 to drive the base of field-effect transistor (IGBT 1). The base electrodes of transistors 8 and 9 are connected to the input terminal of the device. Zener diode 6 and the collector-emitter circuit of NPN auxiliary transistor 5 are connected serially across the base-emitter circuit of IGBT 1, so that the former tends to the biased in the Zener polarity and the latter tends to be forward-biased. The base-emitter circuit of NPN auxiliary transistor 5 is connected across the emitter circuit resistor of IGBT 1. The collector electrode of IGBT 1 is the output terminal of the device.

In FIG. 1, when a main circuit current $i_o$ flowing (illustratively through the output terminal) in the IGBT 1 is a normal value not larger than a predetermined one, the auxiliary transistor 5 is kept off, as is its normal condition, and the Zener diode 6 is independent of the operation of the IBGT 1, so that the IGBT 1 performs such a normal operation as described above with respect to FIG. 4.

If an overcurrent greater than a rated current flows in the IGBT 1 and a voltage higher than the threshold base-emitter voltage $e_{BE}=0.6$ V of the auxiliary transistor 5 in the on state is generated across the resistor 11, then, the transistor turns on, and the gate voltage $e_g$ of the IGBT 1 falls to a value approximate to the Zener voltage of the Zener diode 6. Therefore, the IGBT 1 can limit the overcurrent by itself. In the circuit of FIG. 1, since a large current flows in the resistor 11, the resistance value of the resistor 11 may be selected to be so small that circuit integration can be easily performed.

Figure 2:
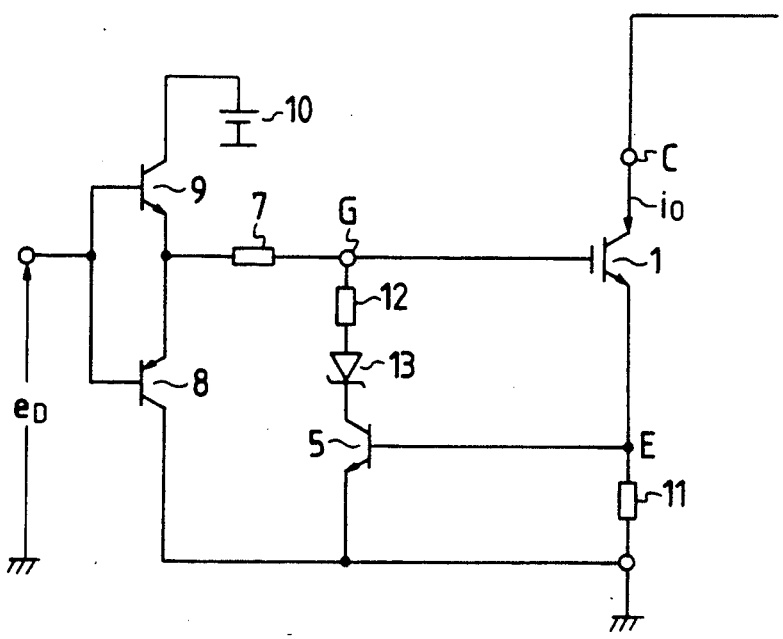
FIG. 2 is a schematic circuit diagram of a second embodiment of the invention.

FIG. 2 shows a second embodiment of the present invention, in which a resistor (a second resistor) 12 is used in place of the Zener diode 6 of FIG. 1. In FIG. 2, however, a Zener diode 13 is inserted in series with the resistor 12 in the direction opposite to the Zener diode 6 of FIG. 1. The Zener diode 13 is used for limiting a reverse bias voltage when the gate G—emitter E circuit of an IGBT 1 is biased reversely.

In FIG. 2, if a main circuit current $i_o$ becomes excessively large so that an auxiliary transistor 5 turns on, the resistor 12 conducts; and a driving signal voltage $e_D$ is divided by the resistors 7 and 12 to be applied to the gate G of the IGBT 1 so that the IGBT 1 limits the main circuit overcurrent $i_o$.

Figure 3:
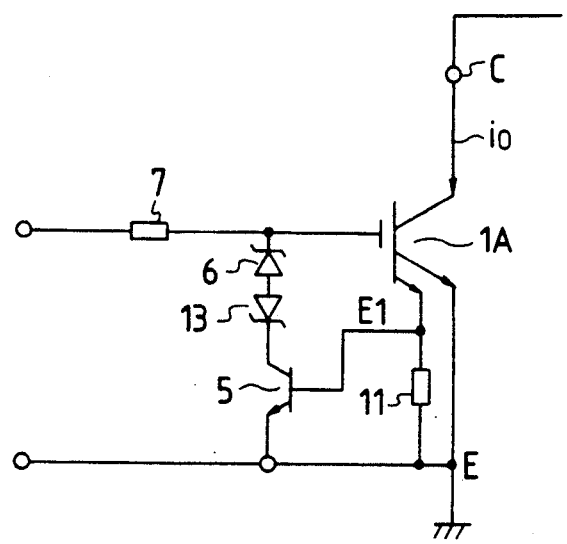
FIG. 3 is a schematic diagram of a third embodiment of the invention.
Figure 4:
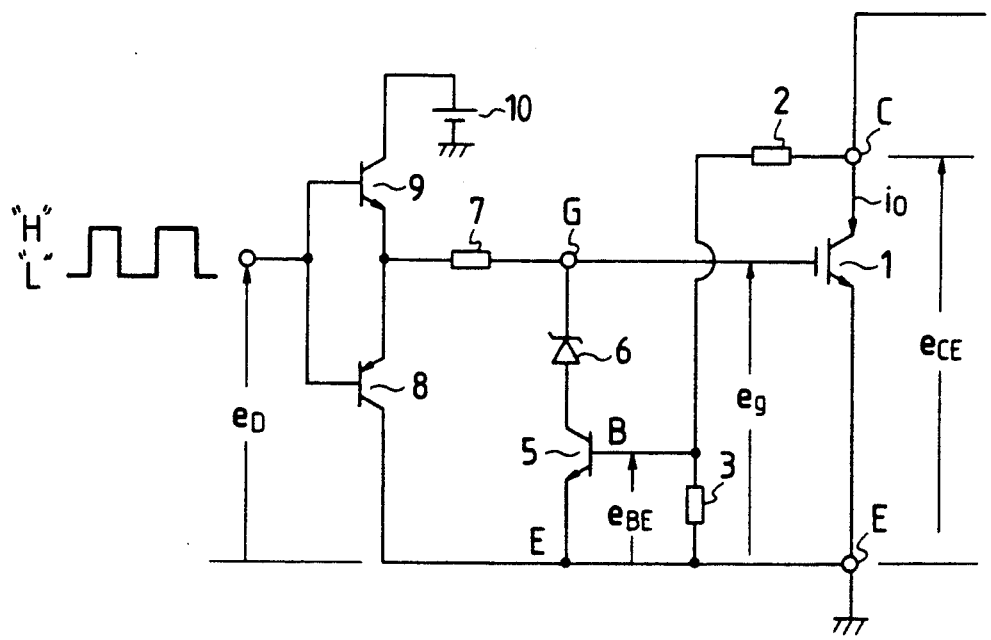
FIG. 4 is a schematic diagram of an arrangement of a related-art device from which the present invention differs.

FIG. 3 shows the configuration of the main part of a third embodiment of the present invention. In the drawing, the Zener diode 13 of FIG. 2 is provided in series with a Zener diode 6 of FIG. 1, and an insulated gate element (IGBT) 1A provided with a current-sensing terminal is used in place of the IGBT 1. In the IGBT 1A, the greater part of a main circuit current $i_o$ flows in one emitter branch E, and on the other hand, the remainder part of the main circuit $i_o$, which is a predetermined fraction of the main circuit current $i_o$ flows in the other emitter E1 branch including the current-sensing resistor 11.

Also in FIG. 3, if the main circuit current $i_o$ exceeds a predetermined value, an auxiliary transistor 5 is turned on by the voltage across a resistor 11, and the Zener diode 6 is made conductive so that the overcurrent $i_o$ is limited substantially in the same manner as in the case of FIG. 1. In the circuit of FIG. 3, advantageously, the power loss of the resistor 11 is reduced in comparison with the circuits of FIGS. 1 and 2 to thereby make it possible to reduce the heating of, and consequently the physical size of, the resistor 11.

Thus, according to the present invention, in all of the embodiments of FIGS. 1-3, the resistor 11 is connected in series to the emitter of the IGBT 1 so that the main circuit current $i_o$ or a part thereof is made to flow in the series resistor 11, and when the voltage across the series resistor 11 exceeds a predetermined value, the auxiliary transistor 5 is turned on to thereby suppress the voltage control signal to be applied to the IGBT 1 so that the main circuit overcurrent is limited by the IGBT 1.

As a consequence of the circuit arrangements of FIGS. 1-3, the resistance value of the resistor 11 for detecting the main circuit current can be made low, and the control circuit for the IGBT 1 can be integrated into one chip, so that the internal configuration of a modular product having the plurality of switching power elements (IGBTs 1) built therein is exceedingly simplified. Further, reduction in number of assembling steps of the module and improvement in yield can be expected in comparison with the case where the control circuit is constituted by parts provided separately from each other (i.e., in a discrete component circuit)

It is possible to expect the same effects also in the case of using an MOS element as the auxiliary transistor 5. Further, the insulated gate element (IGBT) 1 may be an MOSFET or any other semiconductive controlled-path element.

What is claimed is:

1. A semiconductor device comprising:
    an insulated gate main semiconductive element having a gate, a collector and an emitter;
    an auxiliary semiconductive element having a base connected to the main semiconductive element emitter, a collector and an emitter;
    a voltage-dropping semiconductive element connected between the main semiconductive element gate and the auxiliary semiconductive element gate and the auxiliary semiconductive element collector; and
    resistive means, responsive to a predetermined main semiconductive element emitter current, for applying a control voltage across the base and the emitter of the auxiliary semiconductive element.

2. The semiconductive device of claim 1, wherein the voltage-dropping semiconductive element is a Zener diode connected to be biased in the Zener polarity.

3. The semiconductive device of claim 1, wherein the voltage-dropping semiconductive element further comprises, a resistive element connected in series with a Zener diode connected to be biased opposite to the Zener polarity.

4. A semiconductor device comprising:
    an insulated gate main semiconductive element having a gate, a collector, an emitter and an emitter current sensing terminal;
    an auxiliary semiconductive element having a base connected to the emitter current sensing terminal a collector and an emitter;
    a voltage-dropping semiconductive element connected between the main semiconductive element gate and the auxiliary semiconductive element collector; and
    resistive means, responsive to a predetermined current through the emitter current sensing terminal, for applying a control voltage across the base and the emitter of the auxiliary semiconductive element.

5. The semiconductive device of claim 4, wherein the emitter current sensing terminal taps an emitter current of the insulated gate main semiconductive element, whereby a predetermined fraction of the emitter current flows through the resistive means to provide a control voltage across the base and the emitter of the auxiliary semiconductive element.

6. The semiconductive device of claim 4, wherein the voltage-dropping semiconductive element further comprises:
    a first Zener diode connected to be biased in the Zener polarity and in series with;
    a second Zener diode connected to be biased opposite to the Zener polarity.

* * * * *

UNITED STATES PATENT AND TRADEMARK OFFICE
CERTIFICATE OF CORRECTION

PATENT NO. : 5,091,664
DATED : February 25, 1992
INVENTOR(S) : SHOICHI FURUHATA

It is certified that error appears in the above-identified patent and that said Letters Patent is hereby corrected as shown below:

On the title page, [54]: change the title to read --Semiconductor Device With Insulated Gate Element And Overcurrent Protection--.

Claim 1, column 5, line 17, after "element" Delete "gate".

Claim 1, column 5, line 18, Delete "and the auxiliary semiconductor element".

Signed and Sealed this

Twenty-first Day of September, 1993

Attest:

BRUCE LEHMAN

Attesting Officer  Commissioner of Patents and Trademarks